United States Patent
Hsu et al.

(10) Patent No.: US 12,487,519 B2
(45) Date of Patent: Dec. 2, 2025

(54) RETICLE CONTAINER

(71) Applicant: TAIWAN SEMICONDUCTOR MANUFACTURING COMPANY, LTD., Hsinchu (TW)

(72) Inventors: Pei-Cheng Hsu, Taipei (TW); Ta-Cheng Lien, Cyonglin Township (TW); Tzu Yi Wang, Hsinchu (TW); Hsin-Chang Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 618 days.

(21) Appl. No.: 17/589,368

(22) Filed: Jan. 31, 2022

(65) Prior Publication Data

US 2022/0155676 A1    May 19, 2022

Related U.S. Application Data

(62) Division of application No. 16/012,253, filed on Jun. 19, 2018, now Pat. No. 11,237,477.

(Continued)

(51) Int. Cl.
*G03F 7/00* (2006.01)
*G03F 1/66* (2012.01)

(52) U.S. Cl.
CPC ............ *G03F 1/66* (2013.01); *G03F 7/70691* (2013.01); *G03F 7/70825* (2013.01); *G03F 7/70983* (2013.01)

(58) Field of Classification Search
CPC .... G03F 1/66; G03F 7/70691; G03F 7/70733; G03F 7/70741; G03F 7/7075;
(Continued)

(56) References Cited

U.S. PATENT DOCUMENTS 751,345 A    2/1904   Saunders
4,549,843 A  10/1985  Jagusch
(Continued)

OTHER PUBLICATIONS

Non-Final Office Action issued in U.S. Appl. No. 16/012,253, dated Sep. 18, 2020.
(Continued)

*Primary Examiner* — Christina A Riddle
(74) *Attorney, Agent, or Firm* — STUDEBAKER BRACKETT PLLC

(57) ABSTRACT

A mask container for storing a mask for photolithography, includes a cover and a base having a plurality of tapered corners. The tapered corners taper outward and downward from a top major surface of the base. The cover having the tapered corners extends downward that covers the tapered corners of the base when the cover is attached to the base. The tapered corners of the cover are tapered at about the same angle as the tapered corners of the base so that a surface of the tapered corners of the cover is substantially parallel to a corresponding surface of the tapered corner of the base when the cover is attached to the base. A recess is located in the tapered corners of the cover. A biasing member and a ball-shaped member are located in the tapered corners of the base to mate with the recess when the cover is attached to the base.

20 Claims, 10 Drawing Sheets

Related U.S. Application Data

(60) Provisional application No. 62/565,319, filed on Sep. 29, 2017.

(58) Field of Classification Search
CPC .. G03F 7/708; G03F 7/70808; G03F 7/70816; G03F 7/70825; G03F 7/70841; G03F 7/70858; G03F 7/70916; G03F 7/7095; G03F 7/70975; G03F 7/70983; G03F 7/70991; G03F 7/70866; G03F 7/70883; G03F 7/70908–70941; H01L 21/67353; H01L 21/67359; H01L 21/67373
USPC ........ 355/18, 30, 52–55, 67–77, 133; 430/5; 206/701, 710–712, 486
See application file for complete search history.

(56) References Cited

U.S. PATENT DOCUMENTS

| | | | |
|---|---|---|---|
| 4,758,127 A * | 7/1988 | Imai | H01L 21/67775 414/416.08 |
| 5,471,279 A | 11/1995 | Takizawa | |
| 6,105,782 A | 8/2000 | Fujimore | |
| 6,499,935 B1 * | 12/2002 | Hirakawa | G03F 1/66 294/87.26 |
| 8,220,630 B1 | 7/2012 | Ku | |
| 8,231,005 B2 | 7/2012 | Kolbow | |
| 8,739,547 B2 | 6/2014 | Jarmon | |
| 2005/0191947 A1 * | 9/2005 | Chen | B24B 37/32 451/41 |
| 2013/0100430 A1 * | 4/2013 | Lansbergen | G03F 7/70716 355/72 |

OTHER PUBLICATIONS

Final Office Action issued in U.S. Appl. No. 16/012,253, dated Apr. 30, 2021.
Notice of Allowance issued in U.S. Appl. No. 16/012,253, dated Sep. 22, 2021.

* cited by examiner

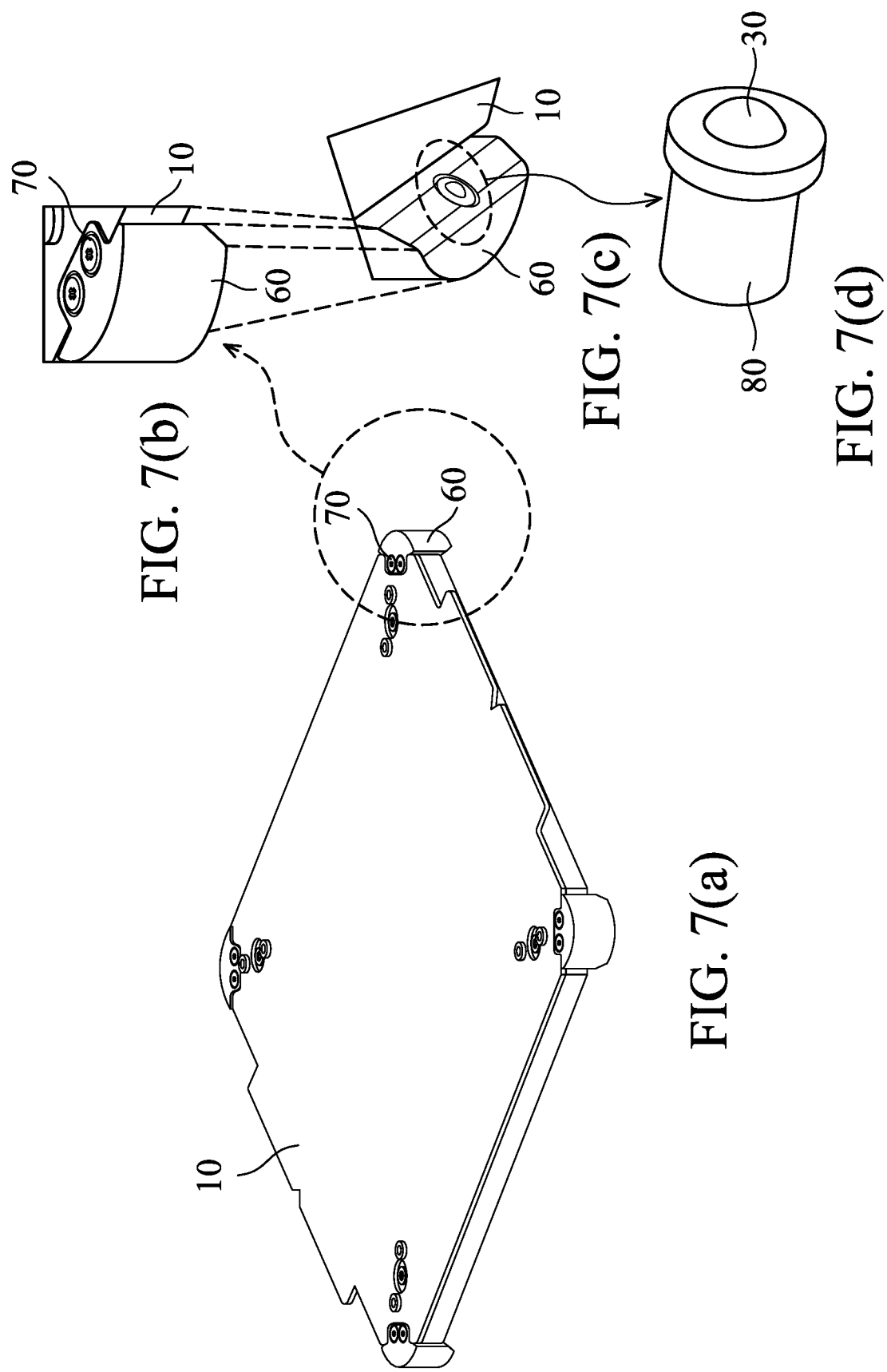

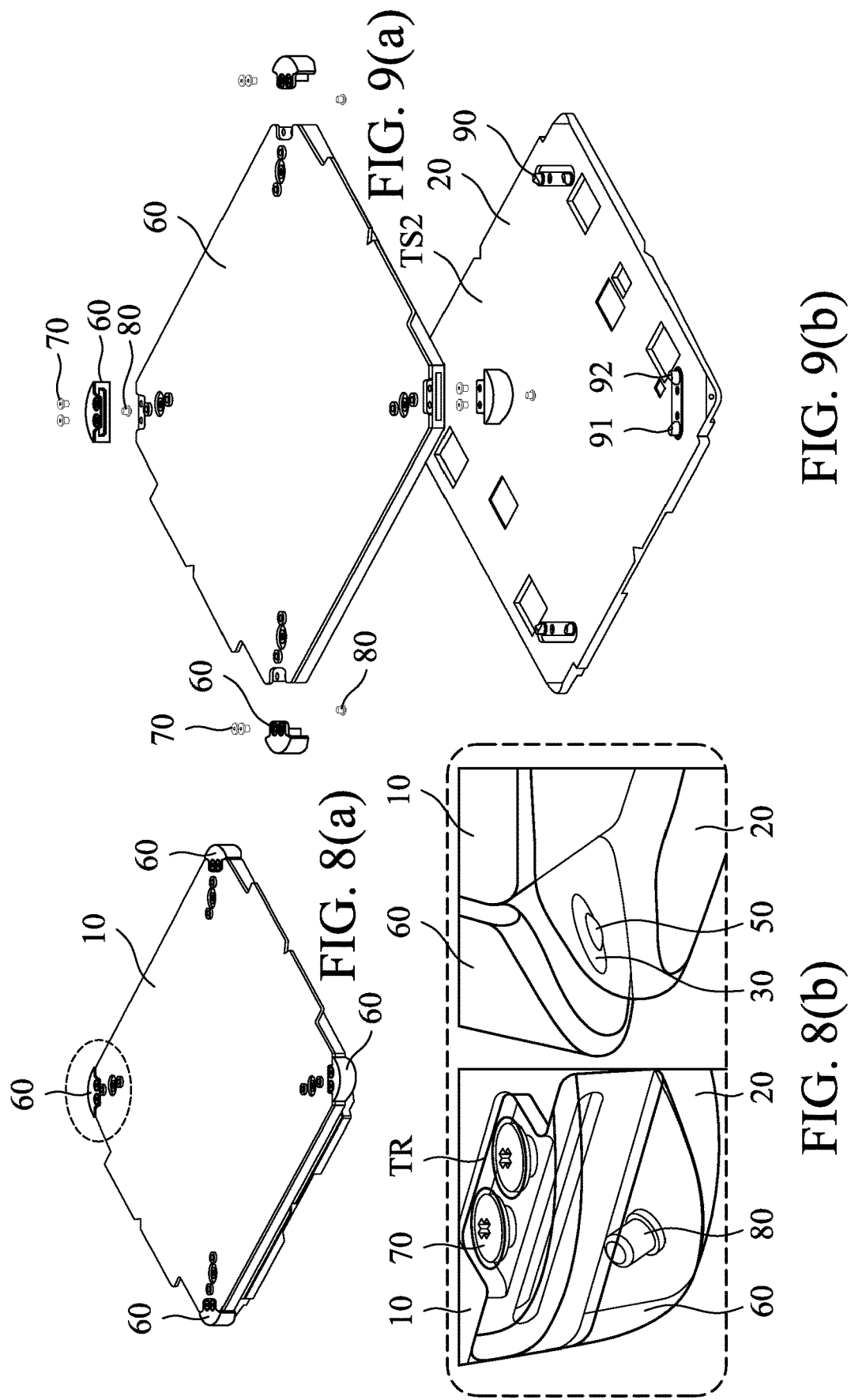

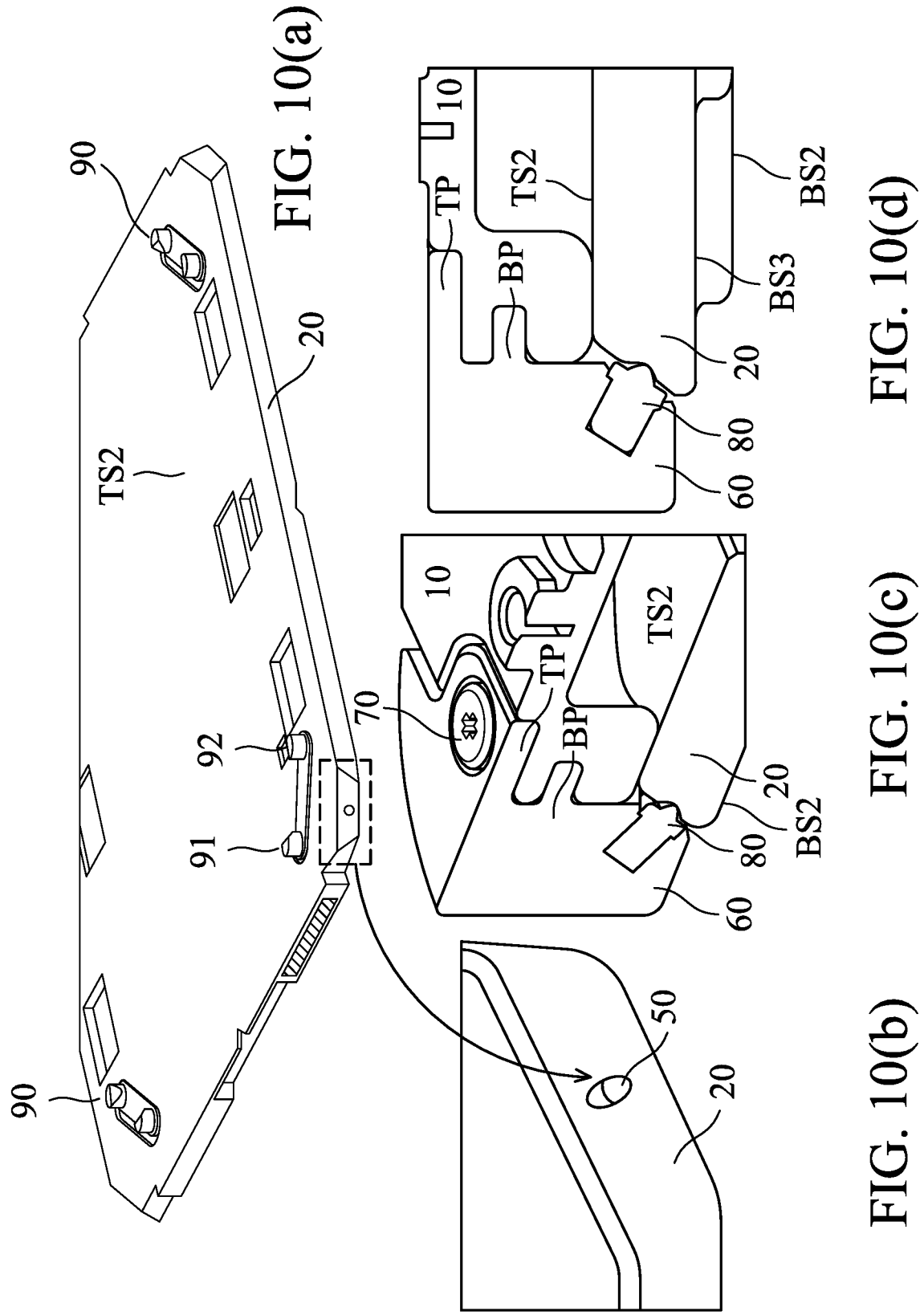

RETICLE CONTAINER

CROSS-REFERENCE TO RELATED APPLICATIONS

The present application is a divisional of U.S. patent application Ser. No. 16/012,253 filed on Jun. 19, 2018 now U.S. Pat. No. 11,237,477, which claims priority to U.S. Provisional Application 62/565,319 filed on Sep. 29, 2017, the entire content of each of which is incorporated herein by reference.

TECHNICAL FIELD

The disclosure relates to containers having a cover and a base used for storing and transporting articles, and more particularly to photolithography mask inner pod covers and bases for transporting and storing masks or blank substrates.

BACKGROUND

A semiconductor chip patterned using photolithography (for example, extreme ultraviolet photolithography or EUV photolithography using 13.5 nm wavelength for patterning) requires a mask or a photo-mask (also called a 'reticle') which is contained in a standardized carrier for transfer to different positions in a clean room or in different clean rooms for different processes. For example, a blank substrate or a blank is transferred in the standardized carrier using manual or robotic methods to different locations or clean rooms for cleaning and mask fabrication. The fabricated mask is also transferred inside the standardized carrier to different locations or clean rooms for photolithography processes, or storage before or after use. The mask carrier (also referred to as a mask container, a mask pod, or a mask box) includes an inner pod and an outer pod. The inner pod contacts the blank substrate or mask, and includes an inner pod cover and an inner pod base or inner pod base plate. The inner pod cover and the inner pod base plate of the inner pod are designed to fit each other with high accuracy.

In case of positional inaccuracy between the inner pod cover and the inner pod base plate due to environmental factors or the dimensional inaccuracy of the inner pod base plate and/or the inner pod cover, when opening or closing the inner pod, there could be contact between inner pod cover and the inner pod base plate. Friction caused by the contact could generate particles that would fall on the inner pod base plate and/or the mask or blank substrate on the inner pod base plate. The inner pod cover and the inner pod base plate are commonly made of metal materials such as aluminum alloy for weight control. The aluminum matrix is coated with nickel, nickel alloy, chromium, or chromium alloy for enhancing mechanical properties. The friction between the inner pod cover and the inner pod base plate would generate particles composed of these metals. Particles remaining on the mask could damage the patterns on the mask or the blank substrate or block the very small wavelength EUV radiation causing image errors. Translation, rotation, or rubbing between the mask or blank substrate in the inner pod with the particles may severely damage the mask or blank substrate. Damaged masks increase the production cost, increase manufacturing time, and require expensive systems for checking the defects in the mask. Thus, the avoidance of particle generation in an inner pod is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7(a) shows a perspective view of an inner pod cover according to an embodiment of the present disclosure. FIG. 7(b) shows a perspective view of the corner structure circled in FIG. 7(a). FIG. 7(c) shows a perspective view of lower side the corner structure hidden in FIG. 7(b) and reveals a polymer ball-shaped member and a ball-holding part. FIG. 7(d) shows the polymer ball-shaped member and the ball-holding part taken out from the corner structure in FIG. 7(b).

FIG. 8(a) shows a perspective view of an inner pod cover with four corner structures, according to an embodiment of the present disclosure, FIG. 8(b) left figure shows an enlarged view of the bottom structure of one of the circled corner structure in FIG. 8(a), and FIG. 8(b) right figure shows a closed state of the mask inner pod by contacting the inner pod cover and the inner pod base plate.

FIG. 9(a) shows an exploded perspective view of the inner pod cover with the corner structures and the fasteners separated from the major piece of the mask inner pod, and FIG. 9(b) shows a perspective view of an inner pod base plate according to an embodiment of the present disclosure.

FIG. 10(a) shows a perspective view of the inner pod base plate according to an embodiment of the present disclosure, FIG. 10(b) shows a corner structure of the inner pod base plate circled in the inner pod base plate in FIG. 10(a), FIG. 10(c) shows a cross-sectional perspective view of the closed mask inner pod with the inner pod cover contacting the inner pod base plate, and FIG. 10(d) shows a two dimensional cross-sectional view in FIG. 10(c).

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

An embodiment of the disclosure is a mask carrier or EUV mask inner pod without the problem of particle generation during opening or closing of the inner pod cover and the inner pod base plate. The present disclosure provides a new inner pod designed to reduce contact of the inner pod cover and the inner pod base plate, so as to reduce the chance of generating particles due to friction between the inner pod cover and the inner pod base plate, and to improve the closing of the inner pod even when there is positional inaccuracy between the inner pod cover and the inner pod base plate.

Figure 1A:
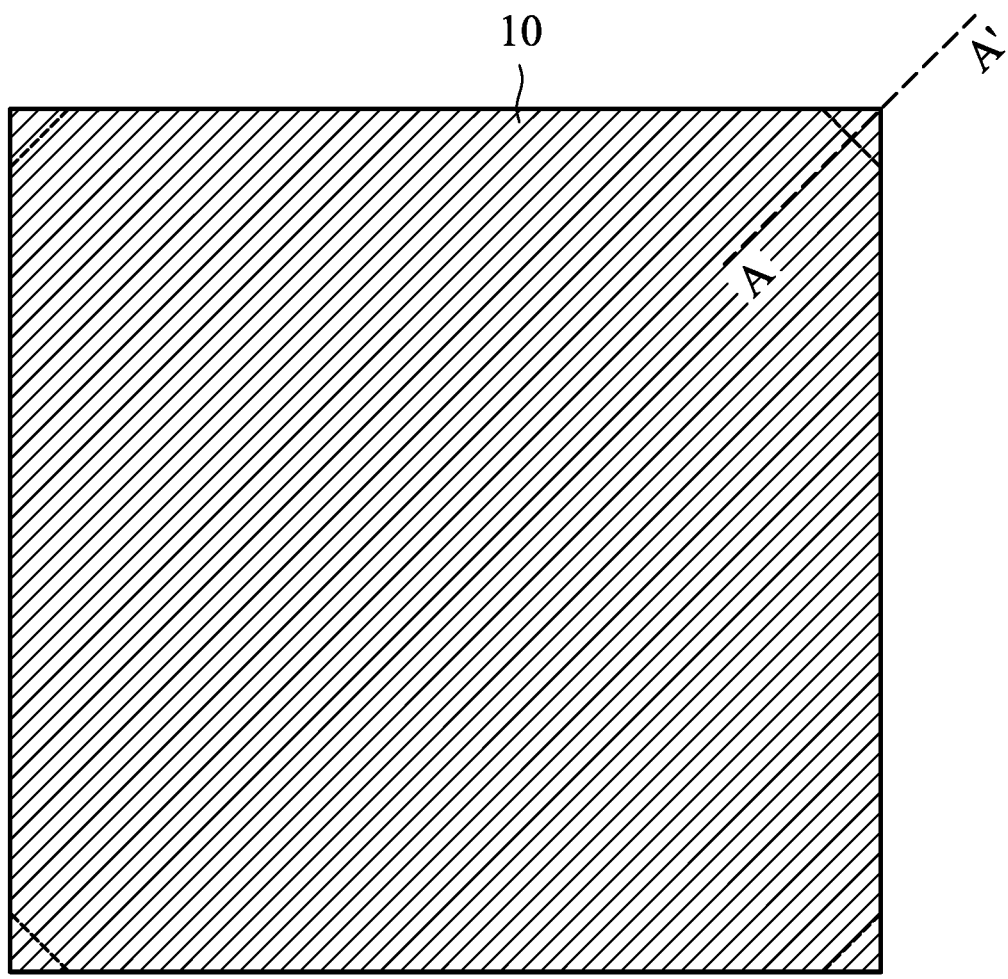
FIG. 1(a) shows a plan view of the inner pod or mask container/carrier, according to an embodiment of the present disclosure.
Figure 1B:
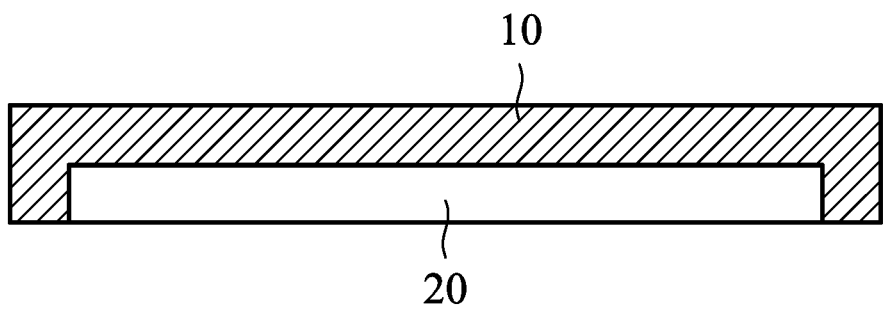
FIG. 1(b) shows a side view of the mask inner pod along a bottom side of the plan view of the inner pod of FIG. 1(a).

FIG. 1(a) shows a plan view of the mask inner pod according to an embodiment of the present disclosure, and FIG. 1(b) shows a side view (not a cross-sectional view) of the mask inner pod, or simply called an inner pod, at a bottom side of the inner pod of FIG. 1(a). The inner pod, including an inner pod cover 10 and an inner pod base plate or inner pod base 20, and a mask or reticle (not shown) is placed on the inner pod base plate 20, thereby protecting the mask stored therein during storage and transport. The mask inner pod is further placed in a mask outer pod in some embodiments of the present disclosure. In some embodiments of the present disclosure, the mask inner pod is an extreme ultraviolet (EUV) mask inner pod for protecting EUV masks or EUV blank substrates.

FIG. 1(b) shows a side view of the inner pod along a bottom side of the plan view of the inner pod of FIG. 1(a). The inner pod base plate 20 has a major area with four cut-corners (not visible in FIG. 1(b)) and the cut-corners are covered by the corner structures of the inner pod cover 10, in some embodiments of the present disclosure. In other embodiments of the present disclosure, the inner pod base plate 20 has a major area with three or two cut-corners while the other remaining corners are 90 degree corners or round corners or a mixture of 90 degree and round corners. When there are two corners cut, the two corners are located at opposite positions along a diagonal of the major surface of the inner pod cover 10, in some embodiments of the present disclosure. The side view in FIG. 1(b) shows that the left and right corners of the inner pod cover 10 have corner structures integrally formed with the inner pod cover 10 and extending from the top surface level of the inner pod cover 10 to the inner pod base plate 20 so as to cover the respective corners of the inner pod base plate 20. In some embodiments of the present disclosure, the corner structure of the inner pod cover 10 has a bottom side higher than a major bottom surface of the inner pod base plate 20 (FIG. 1(b)). In other embodiments of the present disclosure, the corner structure of the inner pod cover 10 has a bottom side at a same horizontal level as the major bottom surface of the inner pod base plate 20. In some embodiments of the present disclosure, the size of the corner structures of the inner pod cover 10 is not limited as long as a ball-shaped member 30 and a biasing member 40 discussed herein can be located in the corner structure of the inner pod cover 10. The cross-sectional shape of the corner structure is an upright trapezoidal shape, in some embodiments of the present disclosure.

The inner pod cover 10 and inner pod base plate 20 are made of nickel coated aluminum alloy in some embodiments of the present disclosure. The nickel coating is Ni—P or Ni—Cr in some embodiments of the present disclosure. Ni—P or Ni—Cr particles can be generated by friction where the inner pod cover 10 and inner pod base plate 20 come into contact. If the friction-generated particles fall on the mask on the inner pod base plate 20, the particles can cause masking image errors when the mask is used for photolithography.

To prevent the formation of particles generated by friction and to prevent the image error in the nanometer-scaled mask pattern, the present disclosure provides a novel configuration of the mask inner pod.

Figure 2A:
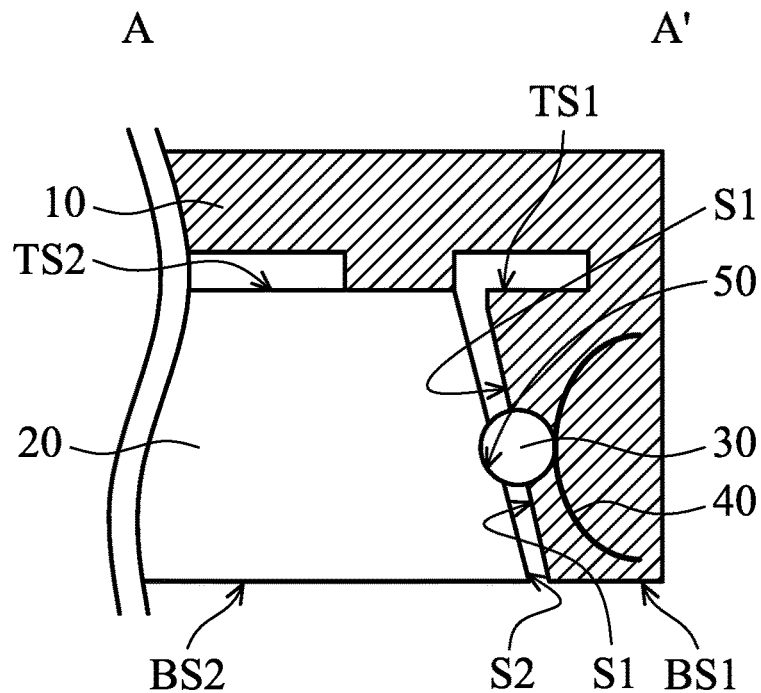
FIG. 2(a) shows a cross-sectional view of the mask inner pod along a cut line A-A' in FIG. 1(a) according to an embodiment of the present disclosure.
Figure 2B:
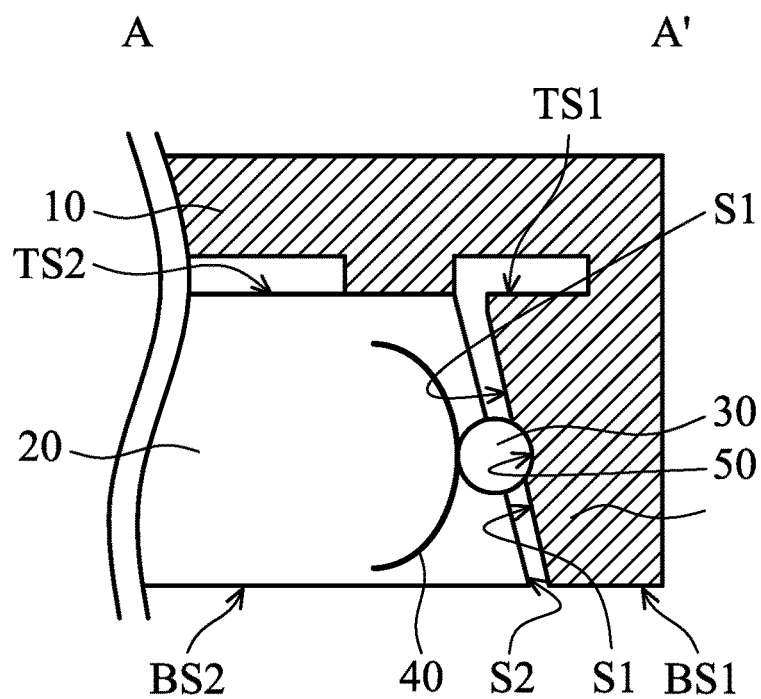
FIG. 2(b) shows a cross-sectional view of the inner pod along the cut line A-A' in FIG. 1(a) according to another embodiment of the present disclosure.

FIG. 2(a) shows a cross-sectional view of the novel mask inner pod along a cut line A-A' in FIG. 1(a) according to an embodiment of the present disclosure, and FIG. 2(b) shows a cross-sectional view of the mask inner pod along the cut line A-A' in FIG. 1(a) according to another embodiment of the present disclosure. As shown in FIGS. 2(a) and 2(b), a ball-shaped member 30, a biasing member 40 (e.g. an axially biasing member such as a coil spring, leaf spring, or torsional spring) and a recess ('dimple') 50 are provided in the corner (FIG. 1(a)) of the inner pod cover 10 and a cut-corner of the inner pod base plate 20 (dotted lines at corners of FIG. 1(a) indicating the hidden edges of the cut-corners of the inner pod base plate 20 covered by the inner pod cover 10). As shown in FIGS. 2(a) and 2(b), the cut-corners of the inner pod base plate 20 are tapered outward and downward from a top major surface TS2 of the inner pod base plate 20, forming an incline surface or tapered surface S2. The top major surface TS2 of the inner pod base plate 20 is the surface on which the mask or blank rests. The inner pod cover 10 has a plurality of corner structures tapered and extending downward and covering the inner pod base plate's 20 tapered cut-corners when the inner pod cover 10 is attached to the inner pod base plate 20, and the tapering of the corner structures of the inner pod cover 10 forms upside-down incline surfaces or tapered surfaces S1 between the bottom surface B S1 of the inner pod cover 10 and the surface TS1 of the corner structure of the inner pod cover 10. The tapered corner structures of the inner pod cover 10 are tapered at about the same angle as the inner pod base plate's 20 tapered cut-corners so that inner pod cover's 10 corner structure's tapered surface S1 is substantially parallel to the corresponding tapered surface S2 of the cut-corner of the inner pod base plate 20 when the inner pod cover 10 is attached to the inner pod base plate 20. The angle of tapering is not limited as long as the inner pod cover 10 can be combined with the inner pod base plate 20.

In the embodiment of FIG. 2(a), a ball-shaped member 30 and a biasing member 40 are located in the inner pod cover's 10 tapered corner structure, while the recess or dimple 50 is located on the tapered surface S2 of the inner pod base plate 20. In the embodiment of FIG. 2(b), the ball-shaped member 30 (including a polymer ball) and the spring 40 is located in the inner pod base plate's 20 tapered cut-corners, while the recess or dimple 50 is located on the tapered surface S1 of the corner structure of the inner pod cover 10. In both embodiments of FIGS. 2(a) and 2(b), the ball-shaped member 30 mates with the recess or dimple 50 when the inner pod cover 10 is attached to the inner pod base plate 20.

In some embodiments of the present disclosure, most of the volume (e.g. more than half of the total volume) of the ball-shaped member 30 is either enclosed in the corner structure of the inner pod cover 10 (e.g. in the embodiment of FIG. 2(a)) or enclosed in the tapered cut-corner of the inner pod base plate 20 (e.g. in the embodiment of FIG. 2(b)).

Figure 3A:
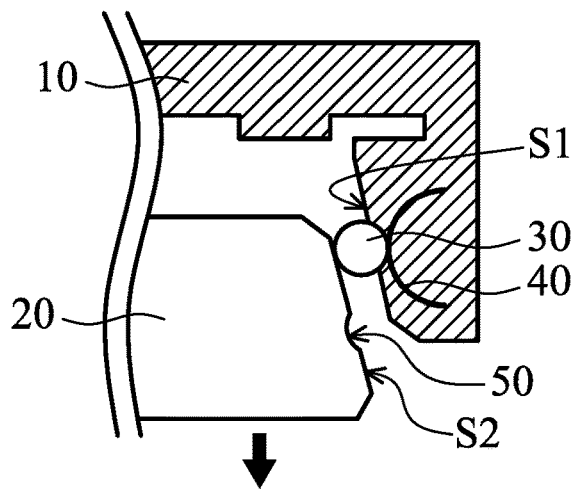
FIGS. 3(a), 3(b), and 3(c) show a process of closing the mask inner pod by lowering the inner pod cover toward the inner pod base plate according to an embodiment of the present disclosure.
Figure 3B:
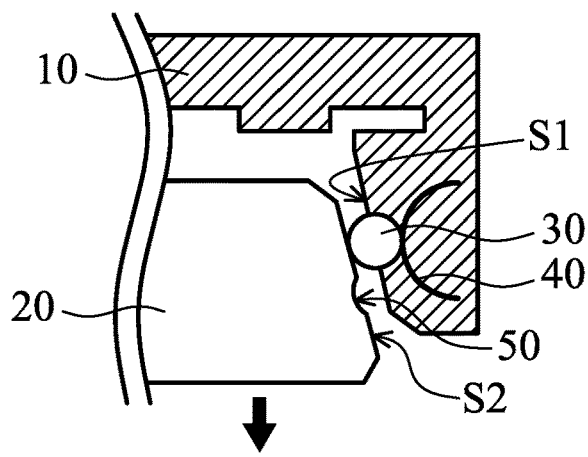
Figure 3C:
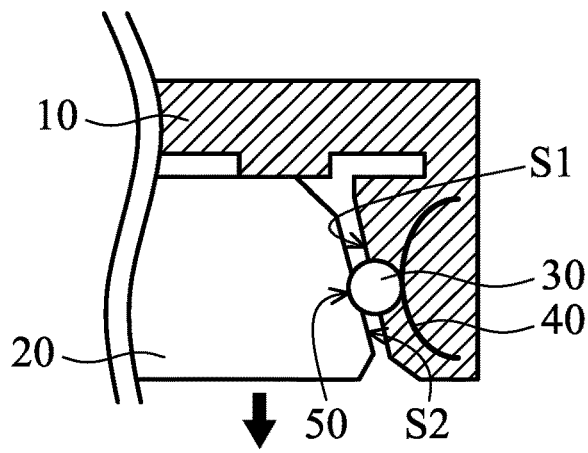
Figure 4A:
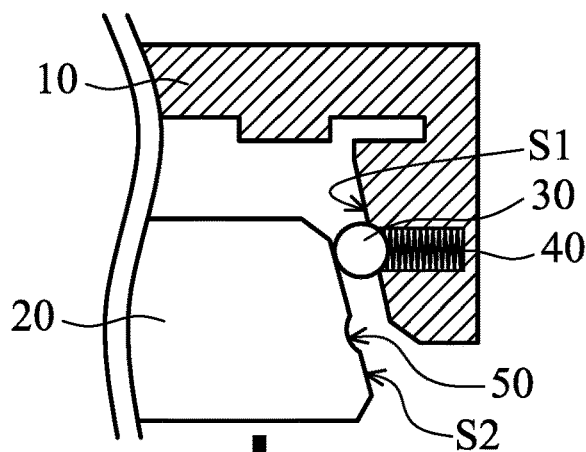
FIGS. 4(a), 4(b), and 4(c) show a process of closing the mask inner pod by lowering the inner pod cover toward the inner pod base plate according to another embodiment of the present disclosure.
Figure 4B:
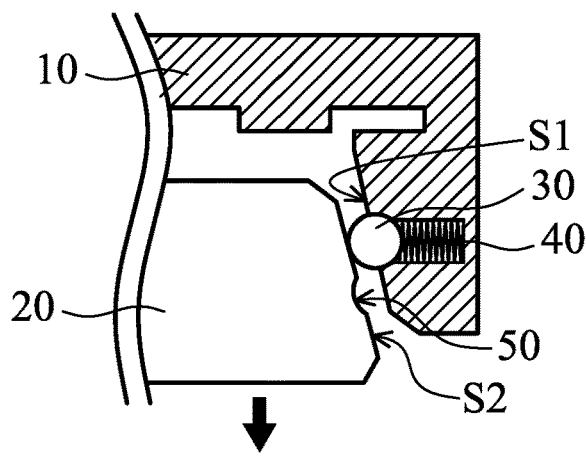
Figure 4C:
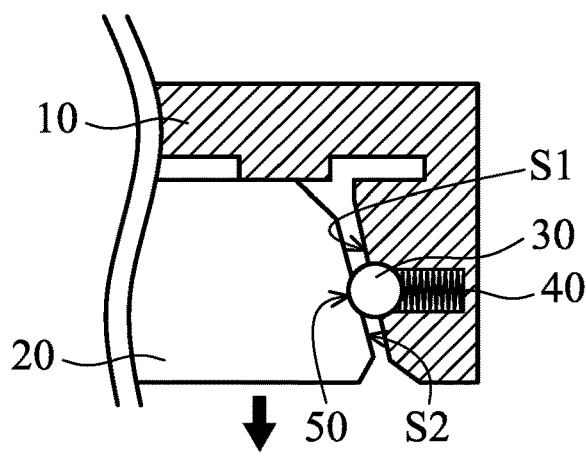
Figure 5A:
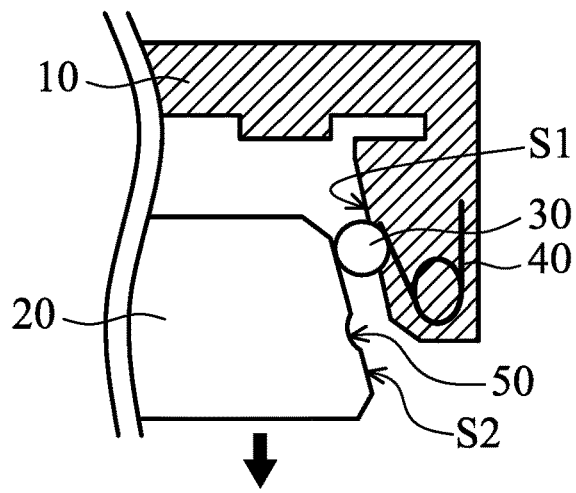
FIGS. 5(a), 5(b), and 5(c) show a process of closing the mask inner pod by lowering the inner pod cover toward the inner pod base plate according to another embodiment of the present disclosure.
Figure 5B:
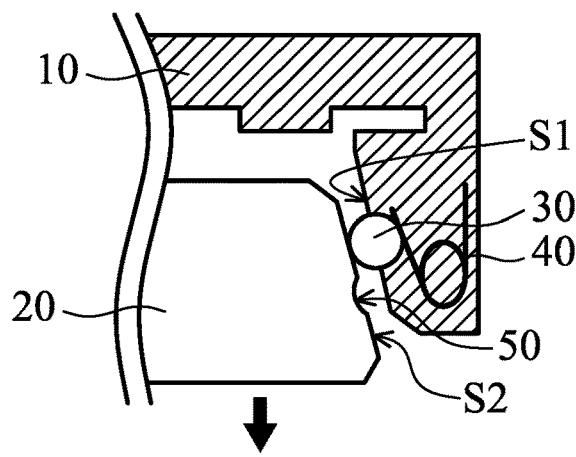
Figure 5C:
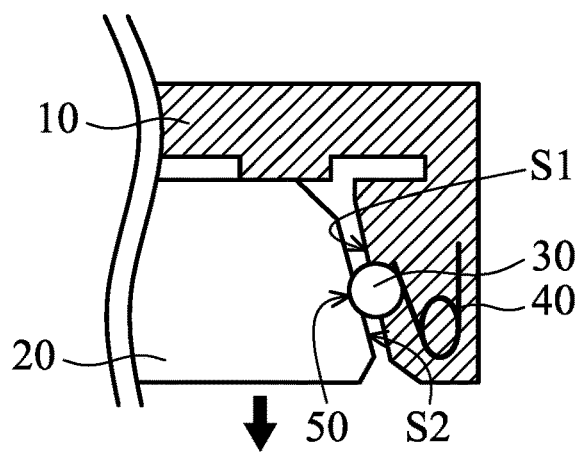

In some embodiments of the present disclosure, the spring 40 is a coil spring (FIGS. 4(a)-4(c)), a leaf spring (FIGS. 2(a) and 2(b) and FIGS. 3(a)-3(c)), or a torsional spring (FIGS. 5(a)-5(c)).

In some embodiments of the present disclosure, the ball-shaped member 30 is made of an elastic polymer. In some embodiments of the present disclosure, the elasticity of the polymer ball is selected to allow the inner pod cover 10 and the inner pod base plate 20 to smoothly slide over each other. In some embodiments of the present disclosure, the polymer ball-shaped member 30 has a Shore D durometer hardness of about 70 to about 90. In some embodiments of the present disclosure, the polymer is selected from the group consisting of polyether ether ketone (PEEK), polyether ketone (PEK), poly(phenylene sulfide) (PPS), polyphenylsulfone (PPSU), polysulfone (PSU), poly(ethersulfone) (PES), polyetherimide (PEI), polyamide-imide (PAI), and polyetherimide (PEI).

In some embodiments of the present disclosure, the recess or dimple 50 is a substantially semi-circular-shaped dimple, as viewed in a cross section (e.g. FIG. 2(a) or 2(b)). In other embodiments of the present disclosure, the recess or dimple 50 can be formed to have other shapes as long as the polymer ball-shaped member 30 is immobilized by mating with it. For example, the recess or dimple 50 may have a triangular shape, pentagon shape, hexagon shape or any shape for mating with the polymer ball-shaped member 30.

In FIGS. 3(a)-3(c), 4(a)-4(c), and 5(a)-5(c), the parts of the embodiments are labelled in the same fashion as that in FIGS. 2(a) and 2(b). FIGS. 3(a), 3(b), and 3(c) show the processes of combining the inner pod cover 10 and the inner pod base plate 20. As the inner pod cover 10 is lowered toward and over the inner pod base plate 20, the tapered corner of the inner pod base plate 20 contacts the polymer ball-shaped member 30 and compresses the leaf spring 40.

When the polymer ball-shaped member 30 reaches the recess or dimple 50, the leaf spring 40 pushes the ball-shaped member 30 into the recess or dimple 50, thereby securing the closed state of the mask inner pod. With the inner pod cover 10 securely combined with the inner pod base plate 20, the inner pod cover 10 is prevented from further movement with respect to the inner pod base plate 20, and the inner pod cover 10 is prevented from directly contacting the inner pod base plate 20. Eliminating the movement and direct contact between the inner pod cover 10 and the inner pod base plate 20 prevents friction between the inner pod cover 10 and the inner pod base plate 20 and prevents the generation of the metal particles. Thus, particulate contamination of a mask stored in the mask inner pod is reduced, and image error when the mask is used for photolithography is reduced. In addition, the cost for checking for particulate defects on the mask stored in the inner pod is reduced.

FIGS. 4(a), 4(b), and 4(c) show processes of combining the inner pod cover 10 and the inner pod base plate 20. As the inner pod cover 10 is lowered toward and over the inner pod base plate 20, the tapered corner of the inner pod base plate 20 contacts the polymer ball-shaped member 30 and compresses the coil spring 40. When the polymer ball-shaped member 30 reaches the recess or dimple 50, the coil spring 40 pushes the ball-shaped member 30 into the recess or dimple 50, thereby securing the closed state of the mask inner pod. With the inner pod cover 10 securely combined with the inner pod base plate 20, the inner pod cover 10 is prevented from further movement with respect to the inner pod base plate 20. Eliminating the movement and direct contact between the inner pod cover 10 and the inner pod base plate 20 prevents friction between the inner pod cover 10 and the inner pod base plate 20 and prevents the generation of the metal particles. Thus, particulate contamination of a mask stored in the mask inner pod is reduced, thereby preventing image error when the mask is used for photolithography. In addition, the cost for checking for particulate defects on the mask stored in the inner pod is reduced.

FIGS. 5(a), 5(b), and 5(c) show processes of combining the inner pod cover 10 and the inner pod base plate 20. As the inner pod cover 10 is lowered toward and over the inner pod base plate 20, the tapered corner of the inner pod base plate 20 contacts the polymer ball-shaped member 30 and compresses the torsional spring 40. When the polymer ball-shaped member 30 reaches the recess or dimple 50, the torsional spring 40 pushes the ball-shaped member 30 into the recess or dimple 50, thereby securing the closed state of the mask inner pod. With the inner pod cover 10 securely combined with the inner pod base plate 20, the inner pod cover 10 is prevented from further movement with respect to the inner pod base plate 20, and the inner pod cover 10 is prevented from directly contacting the inner pod base plate 20. Eliminating the movement and direct contact between the inner pod cover 10 and the inner pod base plate 20 prevents friction between the inner pod cover 10 and the inner pod base plate 20 and prevents the generation of the metal particles. Thus, particulate contamination of a mask stored in the mask inner pod is reduced, thereby preventing image error when the mask is used for photolithography. In addition, the cost for checking for particulate defects on the mask stored in the inner pod is reduced.

Figure 6A:
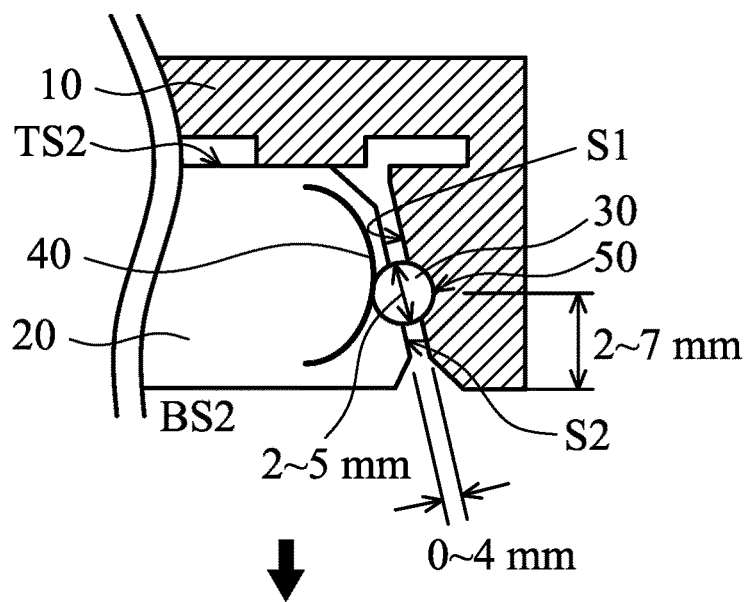
FIG. 6(a) shows the completely closed state of the mask inner pod by lowering the inner pod cover to contact the inner pod base plate according to another embodiment of the present disclosure.

FIG. 6(a) shows the dimensions of the completely closed state of the mask inner pod of FIG. 2(b). The closed mask inner pod includes the inner pod cover 10 and the inner pod base plate 20 contacting each other. The inner pod cover 10 includes a top horizontal plate part having a bottom surface. The bottom surface at the central area of the top horizontal plate part of the mask inner pod cover 10, is spaced apart from the top major surface TS2 of the inner pod base plate 20 to provide space for storing the mask or blank contacting the top major surface TS2 of the inner pod base plate 20, in some embodiments of the present disclosure. In some embodiments of the present disclosure, the mask is placed at the central region of the top major surface TS2 of the inner pod base plate 20, and is not contacted by the inner pod cover 10.

As shown in FIG. 6(a), the polymer ball-shaped member 30 has a diameter of about 2 to 5 mm, in some embodiments of the present disclosure. The separation between the tapered surface S2 of the cut-corner of the inner pod base plate 20 and the tapered surface S1 of the corner structure of the inner pod cover 10 is between about 0 and 4 mm. The height from a horizontal plane of the major bottom surface BS2 of the inner pod base plate 20 to the center of the polymer ball-shaped member 30 is about 2 to 7 mm. In the completely closed state, the contact between the polymer ball-shaped member 30 and the leaf spring 40 is maintained so that the leaf spring 40 applies compressive force to push the polymer ball-shaped member 30 into the recess or dimple 50 which has depth of about 1 to 2 mm in some embodiments of the present disclosure.

Figure 6B:
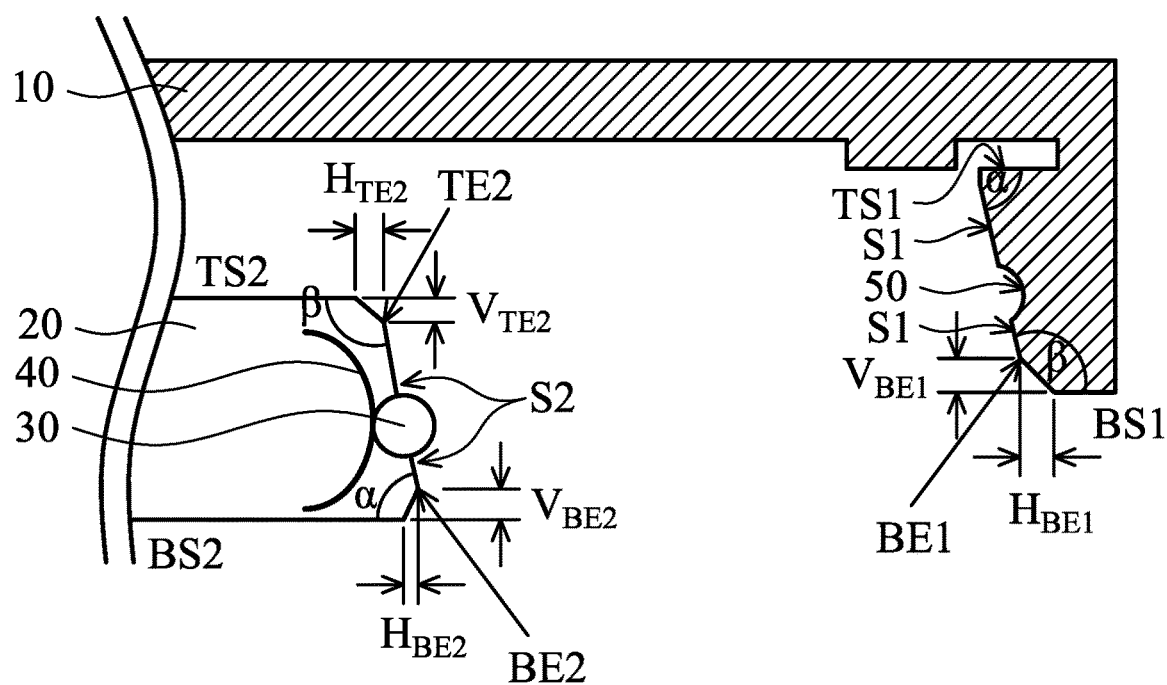
FIG. 6(b) shows the completely opened state of the mask inner pod by lifting the inner pod cover away from the inner pod base plate.

FIG. 6(b) shows the opened state of the inner pod with the inner pod cover 10 disconnected from the inner pod base plate 20. The contact between the polymer ball-shaped member 30 and the leaf spring 40 is maintained, although the compressive force generated by the leaf spring 40 to push the polymer ball-shaped member 30 can be smaller compared to the closed state in FIG. 6(a). In some embodiments of the present disclosure, more than half the volume of the polymer ball-shaped member 30 is embedded in the tapered cut-corner of the inner pod base plate 20.

In FIG. 6(b), the inner pod cover 10 has a tapered surface S1 of a corner structure including a recess or dimple 50 that can cover a surface of the polymer ball-shaped member 30. An acute corner with an acute angle α between the tapered surface S2 of the inner pod base plate 20 and the bottom surface BS2 of the inner pod base plate 20 is cut (FIG. 6(b)) so that a horizontal plane of the bottom edge BE2 of the tapered surface S2 of the cut-corner of the inner pod base plate 20 is a vertical distance $V_{BE2}$ of about 1 to 2 mm above a horizontal plane of the bottom surface BS2 of the inner pod base plate 20. Also, a vertical plane of the bottom edge BE2 of the inner pod base plate 20 is a horizontal distance $H_{BE2}$ of about 1 to 2 mm farther from a vertical plane of an adjacent edge of the bottom surface BS2 of the inner pod base plate 20.

Also, a top obtuse corner with an obtuse angle β between the top major surface TS2 and the tapered surface S2 of the cut-corner of the inner pod base plate 20 is cut (FIG. 6(b)) so that a horizontal plane of the top edge TE2 of the tapered surface S2 of the cut-corner of the inner pod base plate 20 is a vertical distance $V_{TE2}$ of about 1 to 2 mm below a horizontal plane of the top major surface TS2 of the inner pod base plate 20, and a vertical plane of the top edge TE2 of the tapered surface S2 of the cut-corner of the inner pod base plate 20 is a horizontal distance of $H_{TE2}$ of about 1 to 2 mm farther from a vertical plane of the adjacent edge of the top major surface TS2 of the inner pod base plate 20.

Similarly, the obtuse corner with the angle β between a bottom edge BE1 of the tapered surface S1 of the corner structure of the inner pod cover 10 and a bottom surface BS1 of the corner structure of the inner pod cover 10 is cut so that a horizontal plane of the bottom edge BE1 of the tapered surface S1 of the corner structure of the inner pod cover 10 is a vertical distance $V_{BE1}$ of about 1 to 2 mm above a horizontal plane of the bottom surface BS1 of the corner structure of the inner pod cover 10, and a vertical plane of the bottom edge BE1 of the tapered surface S1 is a horizontal distance $H_{BE1}$ of about 1 to 2 mm farther from a vertical plane of the adjacent edge of the bottom major surface BS1 of the inner pod cover 10. The removal of the acute and obtuse corners of the inner pod base plate 20 and the inner pod cover 10 in FIGS. 6(a) and 6(b) is designed to further avoid the contact and friction between the inner pod cover 10 and the inner pod base plate 20.

Figure 6C:
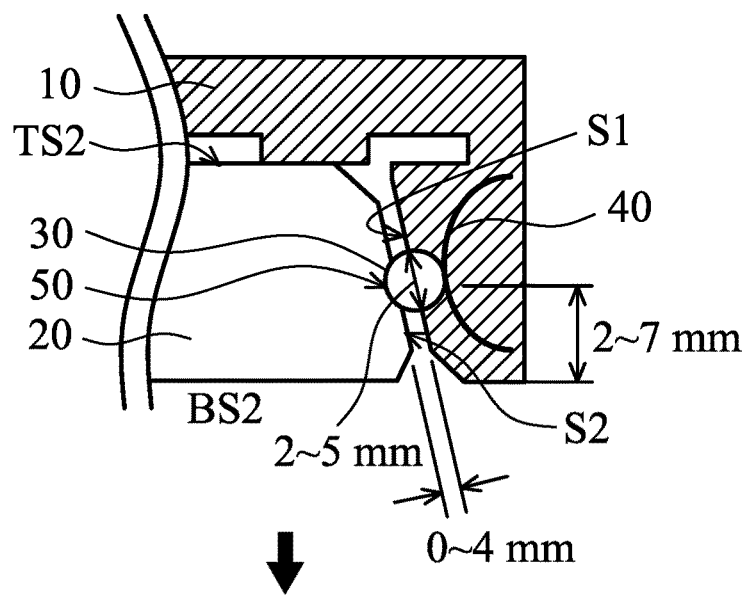
FIG. 6(c) shows the completely closed state of the mask inner pod by lowering the inner pod cover to contact the inner pod base plate according to an embodiment of the present disclosure.

FIG. 6(c) shows the dimensions of the completely closed state of the mask inner pod of FIG. 2(a). The closed mask inner pod includes the inner pod cover 10 and the inner pod base plate 20 contacting each other. The inner pod cover 10 includes a top horizontal plate part having a bottom surface. The bottom surface at the central area of the top horizontal plate part of the mask inner pod cover 10, is spaced apart from the top major surface TS2 of the inner pod base plate 20 to provide space for storing the mask or blank contacting the top major surface TS2 of the inner pod base plate 20, in some embodiments of the present disclosure. In some embodiments of the present disclosure, the mask is placed at the central region of the top major surface TS2 of the inner pod base plate 20, and is not contacted by the inner pod cover 10. As shown in FIG. 6(c), the polymer ball-shaped member 30 has a diameter of about 2 to 5 mm, in some embodiments of the present disclosure. The separation between the tapered surface S2 of the cut-corner of the inner pod base plate 20 and the tapered surface S1 of the corner structure of the inner pod cover 10 is between about 0 and 4 mm. The height from a horizontal plane of the major bottom surface BS2 of the inner pod base plate 20 to the center of the polymer ball-shaped member 30 is about 2 to 7 mm. In the completely closed state, the contact between the polymer ball-shaped member 30 and the leaf spring 40 is maintained so that the leaf spring 40 applies compressive force to push the polymer ball-shaped member 30 into the recess or dimple 50 which has depth of about 1 to 2 mm in some embodiments of the present disclosure.

Figure 6D:
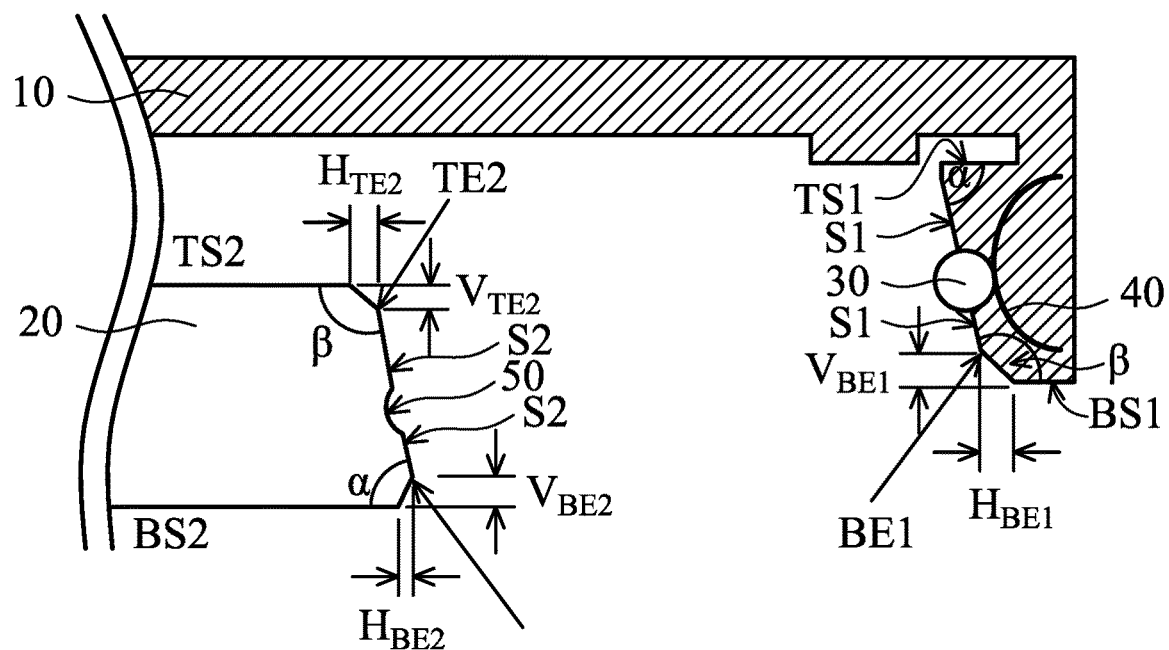
FIG. 6(d) shows the completely opened state of the mask inner pod by lifting the inner pod cover away from the inner pod base plate.

FIG. 6(d) shows the opened state of the inner pod with the inner pod cover 10 disconnected from the inner pod base plate 20. The contact between the polymer ball-shaped member 30 and the leaf spring 40 is maintained, although the compressive force generated by the leaf spring 40 to push the polymer ball-shaped member 30 can be smaller compared to the closed state in FIG. 6(c). In some embodiments of the present disclosure, more than half the volume of the polymer ball-shaped member 30 is embedded in the corner structure of the inner pod cover 10.

In FIG. 6(d), the inner pod base plate 20 has a tapered surface S2 of a cut-corner including a recess or dimple 50 that can cover a surface of the polymer ball-shaped member 30 and the coverage is not limited. The acute corner having angle α between the tapered surface S2 of the inner pod base plate 20 and the bottom surface BS2 of the inner pod base plate 20 is cut (FIG. 6(d)) so that a horizontal plane of the bottom edge BE2 of the tapered surface S2 of the cut-corner of the inner pod base plate 20 is a vertical distance $V_{BE2}$ of about 1 to 2 mm above a horizontal plane of the bottom surface BS2 of the inner pod base plate 20. Also, a vertical plane of the bottom edge BE2 of the inner pod base plate 20 is a horizontal distance $H_{BE2}$ of about 1 to 2 mm farther from a vertical plane of an adjacent edge of the bottom surface BS2 of the inner pod base plate 20.

Also, the top obtuse corner having an angle β between the top major surface TS2 and the tapered surface S2 of the cut-corner of the inner pod base plate 20 is cut (FIG. 6(d)) so that a horizontal plane of the top edge TE2 of the tapered surface S2 of the cut-corner of the inner pod base plate 20 is a vertical distance $V_{TE2}$ of about 1 to 2 mm below a horizontal plane of the top major surface TS2 of the inner pod base plate 20, and a vertical plane of the top edge TE2 of the tapered surface S2 of the cut-corner of the inner pod base plate 20 is a horizontal distance $H_{TE2}$ of about 1 to 2 mm farther from a vertical plane of an adjacent edge of the top major surface TS2 of the inner pod base plate 20.

Similarly, the obtuse corner having an angle β between the tapered surface S1 of the corner structure of the inner pod cover 10 and a bottom surface BS1 of the corner structure of the inner pod cover 10 is cut so that a horizontal plane of the bottom edge BE1 of the tapered surface S1 of the corner structure of the inner pod cover 10 is a vertical distance $V_{BE1}$ of about 1 to 2 mm above a horizontal plane of the bottom surface BS1 of the corner structure of the inner pod cover 10, and a vertical plane of the bottom edge BE1 of the tapered surface S1 is a horizontal distance $H_{BE1}$ of about 1 to 2 mm farther from a vertical plane of the adjacent edge of the bottom major surface BS1 of the inner pod cover 10. The removal of the acute and obtuse corners of the inner pod base plate 20 and the inner pod cover 10 in FIGS. 6(c) and 6(d) is designed to further avoid the contact and friction between the inner pod cover 10 and the inner pod base plate 20.

FIG. 7(a) shows a perspective view of the inner pod cover 10 including corner structures 60 and fasteners 70 fixing the corner structures 60 to the inner pod cover 10. FIG. 7(b) shows a detailed view of the circled region in FIG. 7(a), FIG. 7(c) shows a bottom view of the corner structure 60. FIG. 7(d) shows a detailed view of the circled region in FIG. 7(c). In some embodiments, the inner pod cover is an EUV inner pod cover (or EIP cover).

In FIG. 7(a), each of the corner structures 60 has two fasteners 70 to fix the corner structure 60 in the inner pod cover 10 to prevent any movement of the inner pod cover 10 when the inner pod cover 10 contacts the inner pod base plate 20 in the completely closed state. In other embodiments of the present disclosure, any number of fasteners 70 is allowed as long as the corner structure 60 is securely fixed in the inner pod cover 10. The fasteners 70 can be threaded screws made of polymer material or metal such as stainless steel, carbon steel, and titanium alloy materials. In some embodiments of the present disclosure, the fasteners 70 are used to form non-permanent joint. In other embodiments of the present disclosure, the fasteners 70 are used to form permanent joint, and can be threadless screws, needles, or a solder weld.

The corner structure 60 is formed of any suitable material, including a nickel coated Al alloy or a high performance plastic, in some embodiments of the present disclosure. The high performance plastic includes PEK, PEEK, PPS, PA, PPSU, PSU, and PES. The corner structure 60 is attached to the inner pod cover 10 by fasteners 70. In some embodiments of the present disclosure, the polymer ball-shaped member 30 and the biasing member 40 are contained in an enclosure or ball-holding part 80, which is inserted into a hole provided in the tapered surface of the corner structure 60. In some embodiments of the present disclosure, the enclosure or ball-holding part 80 is made of a high performance plastic. The corner structure 60 is made of the same material as the inner pod cover 10, in some embodiments of the present disclosure. In other embodiments of the present disclosure, the corner structure 60 is made of a material different from the inner pod cover 10. The corner structure 60 has a rounded outer surface, in some embodiments of the present disclosure. In other embodiments of the present disclosure, the corner structure 60 has a 90 degree corner, depending on the requirement of the inner pod during manual or robotic manipulation in the lithographic processes.

In FIG. 7(c), the polymer ball-shaped member 30 protrudes from the tapered surface of the corner structure 60 of the inner pod cover 10. FIG. 7(d) is a detailed view of the circled region in FIG. 7(c). As shown in FIG. 7(d), the ball-holding part 80 surrounding and holding the polymer ball-shaped member 30 has a cylindrical shape with the larger-diameter top portion having a hole from which the polymer ball-shaped member 30 protrudes, and the portion below the larger-diameter top portion has a smaller diameter. The region between the larger-diameter portion and the smaller-diameter portion has an indentation facilitated for the ball-holding part 80 to fix into the corner structure 60 which has a tiny protrusion (not shown) inside the hole to mate with the indentation of the ball-holding part 80 so as to secure the ball-holding part 80 in the corner structure 60 in some embodiments of the present disclosure.

FIGS. 8(a), 8(b), 9(a), and 9(b) show the structures of the inner pod cover 10 and inner pod base plate 20 according to an embodiment of the present disclosure. In the embodiment shown in FIG. 8(a), the inner pod cover 10 has four corner structures 60. In FIG. 8(b) the corner structure 60 is drawn to be transparent with outlines indicating that the corner structure 60 has a top protrusion TP and bottom protrusion BP, with the top protrusion TP inserted into a top space provided by the inner pod cover 10 while the bottom protrusion BP is inserted into a hole formed in the inner pod cover 10 so as to secure the corner structure 60 with the inner pod cover 10 when the fasteners 70 are inserted into the aligned holes (not shown) provided in the top protrusion TP and the bottom protrusion BP of the corner structure 60 and provided in the portion of the inner pod cover 10 between the top and the bottom protrusions TP and BP of the corner structure 60. The left figure of FIG. 8(b) shows that the ball-holding part 80 penetrates into the corner structure 60. The right figure of FIG. 8(b) shows a bottom perspective view of the corner structure 60 and the inner pod base plate 20 which is drawn to be transparent with outlines to indicate the shape of the inner pod base plate 20. The right figure of FIG. 8(b) shows that the polymer ball-shaped member 30 is fitted into the recess or dimple 50 of the inner pod base plate 20.

FIG. 9(a) shows an exploded perspective view of an inner pod cover 10 according to an embodiment of the present disclosure. FIG. 9(a) shows the structure of the inner pod cover 10 described in FIGS. 8(a) and 8(b). FIG. 9(b) shows that the inner pod base plate 20 further includes alignment members or guides 90 fixed to the corners of the inner pod base plate 20. The alignment members or guides 90 have a shape protruding into the space in the central region of the inner pod cover 10 so as to maintain an open space provided at the central region of the inner pod cover 10 at the central region of the inner pod base plate 20 for the mask or blank. Further, the alignment members or guides 90 secure the mask placed onto the top major surface of the inner pod base plate 20 so that the mask does not move during transfer and generate particles by friction. The alignment member 90 is made of a polymer material including the above-listed polymer materials used to make the polymer ball-shaped member 30 in some embodiments of the present disclosure.

As shown in FIG. 9(b), the alignment member 90 is a beam shape protrusion protruding from the top major surface TS2 of the inner pod base plate 20, in some embodiments of the present disclosure. In other embodiments of the present disclosure, the shape of the alignment member 90 can be any shape including a triangular shape as long as the purpose of alignment between the space provided by the central region of the inner pod cover 10 and the central region of the inner pod base plate 20 is achieved. Also, FIG. 9(b) shows that the alignment members 90 have two vertical protrusions 91 and 92 formed at both opposite ends of the alignment members 90, in some embodiments of the present application. In other embodiments of the present disclosure, the alignment member 90 has a one-piece protrusion formed from one end to another opposite end of the alignment member 90.

Although the inner pod cover 10 and the inner pod base plate 20 are shown as having a substantially rectangular shape in the exemplary embodiments, other shapes of the inner pod cover 10 and the inner pod base plate 20 are within the scope of the present disclosure. The inner pod cover 10 and the inner pod base plate 20 can be other polygonal shapes including triangular, hexagonal, and octagonal, or substantially curved shapes including semi-circular, circular, and oval. The substantially curved shapes can further include tapered shapes like the tapered surfaces of the cut-corners of the inner pod base plate 20 or the tapered surface of the corner structure of the inner pod cover 10.

FIGS. 10(a), 10(b), 10(c), and 10(d) illustrate detailed views of the tapered corner regions of the inner pod cover 10 and the inner base plate 20, according to an embodiment of the present disclosure. The inner pod base plate 20 shown in FIG. 10(a) has additional (not labeled) indentations formed on the major surface TS2 for the purpose of reducing the contact between the inner pod cover 10 and the inner pod base plate 20 and/or the mask stored therein. Also, the inner pod base plate 20 shown in FIG. 10(a) optionally includes a polymer film fixed onto the top major surface TS2 of the inner pod base plate 20 to reduce the contact between the inner pod cover 10 and the inner pod base plate 20.

FIG. 10(b) shows an enlarged view of the tapered corner showing a circular-shaped recess or dimple 50, in some embodiments of the present disclosure. The recess or dimple 50 can be any shape including triangular shape, rectangular shape, pentagon shape, hexagon shape, or any shape as long as the ball-shaped member 30 can be immobilized by mating with it. The recess or dimple 50 can be formed on the incline tapered surface of the cut-corner of the inner pod base plate 20 or can be another component that is implemented to the inner pod base plate 20 by other methods such as using adhesive or welding method.

FIG. 10(c) shows a cross-sectional perspective view of the corner region showing the top protrusion TP and the bottom protrusion BP of the corner structure 60 inserted into two spaces provided in the inner pod cover 10. As shown in FIG. 10(c), the top protrusion TP has a longer horizontal length than the bottom protrusion BP, in some embodiments of the present disclosure. The longer top protrusion TP allows the fastener 70 to pass through so as to fix the corner structure 60 to the inner pod cover 10. The shorter bottom protrusion BP of the corner structure 60 penetrates into a space or hole provided by the inner pod cover 10 so as to fix the position of the corner structure 60 with respect to the inner pod cover 10. In the embodiment shown in FIG. 10(c), the shorter bottom protrusion BP of the corner structure 60 does not allow the fastener 70 to pass through. In another embodiment of the present disclosure, the bottom protrusion BP of the corner structure 60 has a same horizontal length as the top protrusion TP of the corner structure 60 so as to allow the fastener 70 to pass through. In further embodiments of the present disclosure, the bottom protrusion BP of the corner structure 60 has a longer horizontal length than the top protrusion TP so as to prevent the motion or any possibility of dislocation of the corner structure 60 with respect to the inner pod cover 10.

The ball-holding part 80 and the polymer ball-shaped member 30 are inserted into the space provided in the corner structure 60 of the inner pod cover 10. The inner pod cover 10 has an upper structure designed for assembly with the mask outer pod for robust transportation of the mask inside the mask inner pod cover 10. FIG. 10(d) is a two-dimensional cross-sectional view showing the inner pod base plate 20 has an optional space provided at the edge so that a horizontal plane of the bottom surface BS3 of the edge of the inner pod base plate 20 is above a horizontal plane of the major bottom surface BS2 of the inner pod base plate 20.

The mask inner pod presented in the present disclosure is not limited to masks, and the inner pod can be used as a container for any component such as electronic components or electromechanical components such as thin film induction components, electronic memories, solid state drives etc.

An embodiment according to the present disclosure includes a container for storing an article. The container includes a base having a plurality of tapered corners. The tapered corners taper outward and downward from a top major surface of the base. The container also includes a cover having a plurality of tapered corners extending downward that cover the tapered corners of the base when the cover is attached to the base. The tapered corners of the cover are tapered at about the same angle as the tapered corners of the base so that a surface of the tapered corners of the cover is substantially parallel to a corresponding surface of the tapered corner of the base when the cover is attached to the base. The container also includes a biasing member and a ball-shaped member located in the tapered corners of the base, and a recess located in the tapered corners of the cover. The ball-shaped member mates with the recess when the cover is attached to the base. In some embodiments of the present disclosure, the biasing member of the container includes an axially biasing member. In some embodiments of the present disclosure, the axially biasing member includes one of a coil spring, a leaf spring, and a torsion spring. In some embodiments of the present disclosure, the ball-shaped member is in contact with the biasing member, and the ball-shaped member is made of a polymer. In some embodiments of the present disclosure, the container is made of a polymer selected from the group consisting of polyether ether ketone (PEEK), polyether ketone (PEK), poly(phenylene sulfide) (PPS), polyphenylsulfone (PPSU), polysulfone (PSU), poly(ethersulfone) (PES), polyetherimide (PEI), polyamide-imide (PAI), and polyetherimide (PEI). In some embodiments of the present disclosure, the ball-shaped member has a Shore D durometer hardness of about 70 to about 90. In some embodiments of the present disclosure, the ball-shaped member and the biasing member are contained in an enclosure and the enclosure is made of a polymer. In some embodiments of the present disclosure, the cover contacts the base only through contacting the tapered corners of the cover and the tapered corners of the base. In some embodiments of the present disclosure, the cover contacts the base only through contacting the biasing member and the recess. In some embodiments of the present disclosure, the tapered corners of the cover are formed integrally with the cover. The base further includes alignment members. Each of the alignment members has vertical protrusions located at opposite ends of the alignment members. The alignment members are formed of polymer. In some embodiments of the present disclosure, the base has four tapered corners. In some embodiments of the present disclosure, the base has a space provided at an edge of the base so that a horizontal plane of the edge is above a horizontal plane of a major bottom surface of the base. In some embodiments of the present disclosure, the container is an inner pod for an extreme ultraviolet (EUV) mask, the cover is an inner pod cover, and the base is an inner pod base.

Another embodiment according to the present disclosure includes a container for storing an article. The container includes a base having a plurality of tapered corners. The tapered corners taper outward and downward from a top major surface of the base. The container also includes a cover having a plurality of integrated tapered corners extending downward that cover the tapered corners of the base when the cover is attached to the base. The tapered corners of the cover are tapered at about the same angle as the tapered corners of the base so that a surface of the tapered corners of the cover is substantially parallel to a corresponding surface of the tapered corner of the base when the cover is attached to the base. The container also includes a biasing member and a ball-shaped member located in the tapered corners of the cover, and a recess located in the tapered corners of the base. The ball-shaped member mates with the recess when the cover is attached to the base. In some embodiments of the present disclosure, the biasing member of the container includes an axially biasing member. The axially biasing member includes one of a coil spring, a leaf spring, and a torsion spring. The ball-shaped member is in contact with the biasing member, and the ball-shaped member is made of a polymer. In some embodiments of the present disclosure, the container is made of a polymer selected from the group consisting of polyether ether ketone (PEEK), polyether ketone (PEK), poly(phenylene sulfide) (PPS), polyphenylsulfone (PPSU), polysulfone (PSU), poly(ethersulfone) (PES), polyetherimide (PEI), polyamide-imide (PAI), and polyetherimide (PEI). The ball-shaped member has a Shore D durometer hardness of about 70 to about 90. In some embodiments of the present disclosure, the ball-shaped member and the biasing member are contained in an enclosure and the enclosure is made of a polymer. In some embodiments of the present disclosure, the cover contacts the base only through contacting the tapered corners of the cover and the tapered corners of the base. In some embodiments of the present disclosure, the cover contacts the base only through contacting the biasing member and the recess. In some embodiments of the present disclosure, the tapered corners of the cover are formed integrally with the cover. The base further includes alignment members. Each of the alignment members has vertical protrusions located at opposite ends of the alignment members. The alignment members are formed of polymer. In some embodiments of the present disclosure, the base has four tapered corners. In some embodiments of the present disclosure, the base has a space provided at an edge of the base so that a horizontal plane of the edge is above a horizontal plane of a major bottom surface of the base. In some embodiments of the present disclosure, the container is an inner pod for an extreme ultraviolet (EUV) mask, the cover is an inner pod cover, and the base is an inner pod base.

Another embodiment according to the present disclosure is a container for storing an article. The container includes a base having a plurality of tapered corners. The tapered corners taper outward and downward from a top major surface of the base. The container also includes a cover having a plurality of detachable tapered corners extending downward that cover the tapered corners of the base when the cover is attached to the base. The tapered corners of the cover are tapered at about the same angle as the tapered corners of the base so that a surface of the tapered corners of the cover is substantially parallel to a corresponding surface of the tapered corner of the base when the cover is attached to the base. The container also includes a biasing member and a ball-shaped member located in the tapered corners of the cover, and a recess located in the tapered corners of the base. The ball-shaped member mates with the recess when the cover is attached to the base. In some embodiments of the present disclosure, the biasing member of the container includes an axially biasing member. The axially biasing member includes one of a coil spring, a leaf spring, and a torsion spring. The ball-shaped member is in contact with the biasing member, and the ball-shaped member is made of a polymer. In some embodiments of the present disclosure, the container is made of a polymer selected from the group consisting of polyether ether ketone (PEEK), polyether ketone (PEK), poly(phenylene sulfide) (PPS), polyphenylsulfone (PPSU), polysulfone (PSU), poly(ethersulfone) (PES), polyetherimide (PEI), polyamide-imide (PAI), and polyetherimide (PEI). The ball-shaped member has a Shore D durometer hardness of about 70 to about 90. In some embodiments of the present disclosure, the ball-shaped member and the biasing member are contained in an enclosure and the enclosure is made of a polymer. In some embodiments of the present disclosure, the cover contacts the base only through contacting the tapered corners of the cover and the tapered corners of the base. In some embodiments of the present disclosure, the cover contacts the base only through contacting the biasing member and the recess. In some embodiments of the present disclosure, the tapered corners of the cover are formed integrally with the cover. The base further includes alignment members. Each of the alignment members has vertical protrusions located at opposite ends of the alignment members. The alignment members are formed of polymer. In some embodiments of the present disclosure, the base has four tapered corners. In some embodiments of the present disclosure, the base has a space provided at an edge of the base so that a horizontal plane of the edge is above a horizontal plane of a major bottom surface of the base. In some embodiments of the present disclosure, the container is an inner pod for an extreme ultraviolet (EUV) mask, the cover is an inner pod cover, and the base is an inner pod base.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A mask container for storing a mask for photolithography, comprising:

a base having a plurality of tapered corners, wherein the tapered corners taper outward and downward from corners of a top major surface of the base to corners of a bottom major surface;
a cover having a plurality of tapered corners extending downward that cover the tapered corners of the base when the cover is attached to the base, wherein the tapered corners of the cover are tapered so that a surface of the tapered corners of the cover faces a corresponding surface of the tapered corner of the base when the cover is attached to the base;
a ball-shaped member and a biasing member configured to press the ball-shaped member, which are located in the tapered corners of the base, respectively;
a recess located in the tapered corners of the cover, respectively; and
an opening in the cover above the tapered corners and extending further in the cover than the recess in a direction towards an outermost side surface of the cover as viewed in cross-section,
wherein an acute corner angle exists between a lower surface of the opening and an upper surface portion of the tapered corners of the cover as viewed in cross-section,
wherein an obtuse corner angle exists between a bottom surface of the tapered corners of the cover and a lower surface portion of the tapered corners of the cover as viewed in cross-section, and
wherein the ball-shaped member mates with the recess when the cover is attached to the base.

2. The mask container according to claim 1, wherein the biasing member includes a leaf spring.

3. The mask container according to claim 1, wherein the biasing member includes a coil spring.

4. The mask container according to claim 1, wherein the biasing member includes a torsion spring.

5. The mask container according to claim 1, wherein the ball-shaped member is made of a polymer.

6. The mask container according to claim 5, wherein the polymer is selected from the group consisting of polyether ether ketone (PEEK), polyether ketone (PEK), poly(phenylene sulfide) (PPS), polyphenylsulfone (PPSU), polysulfone (PSU), poly(ethersulfone) (PES), polyetherimide (PEI), polyamide-imide (PAI), and polyetherimide (PEI).

7. The mask container according to claim 1, wherein the ball-shaped member has a Shore D durometer hardness of 70 to 90.

8. The mask container according to claim 1, wherein the ball-shaped member and the biasing member are contained in an enclosure.

9. The mask container according to claim 8, wherein the enclosure is made of a polymer.

10. The mask container according to claim 1, wherein the cover contacts the base only through contacting the biasing member and the recess.

11. The mask container according to claim 1, wherein the tapered corners of the cover are formed integrally with the cover.

12. The mask container according to claim 1, wherein the base has four tapered corners.

13. The mask container according to claim 1, wherein the recess has a triangular shape, pentagon shape, or hexagon shape.

14. A mask container for storing a mask for photolithography, comprising:
a base having four tapered corners, wherein the four tapered corners taper outward and downward from corners of a top major surface of the base to corners of a bottom major surface of the base;
a cover having four tapered corners extending downward that cover the four tapered corners of the base when the cover is attached to the base, wherein the four tapered corners of the cover are tapered so that a surface of the four tapered corners of the cover faces a corresponding surface of the four tapered corners of the base when the cover is attached to the base;
a biasing member and a ball-shaped member located in the four tapered corners of the base, respectively;
a recess located in the four tapered corners of the cover, respectively; and
an opening in the cover above the four tapered corners of the cover and extending further in the cover than the recess in a direction towards an outermost side surface of the cover as viewed in cross-section,
wherein an acute corner angle exists between a lower surface of the opening and an upper surface portion of the tapered corners of the cover as viewed in cross-section,
wherein an obtuse corner angle exists between a bottom surface of the tapered corners of the cover and a lower surface portion of the tapered corners of the cover as viewed in cross-section, and
wherein the ball-shaped member mates with the recess when the cover is attached to the base.

15. The mask container according to claim 14, wherein the base further includes alignment members.

16. The mask container according to claim 15, wherein each of the alignment members has vertical protrusions located at opposite ends of the alignment members.

17. The mask container according to claim 15, wherein the alignment members are formed of a polymer.

18. A mask container for storing a mask for photolithography, comprising:
a base having a tapered corner, wherein the tapered corner tapers outward and downward from a corner of a top major surface of the base to a corner of a bottom major surface of the base;
a cover comprising:
a tapered corner extending downward that covers the tapered corner of the base when the cover is attached to the base; and
a protrusion extending from an inner surface of the cover, which contacts the base when the cover is attached to the base;
a biasing member and a ball-shaped member located in the tapered corner of the base;
a recess located in the tapered corner of the cover; and
an opening in the cover above the tapered corner and extending further in the cover than the recess in a direction towards an outermost side surface of the cover as viewed in cross-section,
wherein an acute corner angle exists between a lower surface of the opening and an upper surface portion of the tapered corner of the cover as viewed in cross-section,
wherein an obtuse corner angle exists between a bottom surface of the tapered corner of the cover and a lower surface portion of the tapered corner of the cover as viewed in cross-section, and
wherein the ball-shaped member mates with the recess when the cover is attached to the base.

19. The mask container according to claim 18, wherein the base has a space provided at an edge of the base so that a horizontal plane of the edge is above a horizontal plane of a major bottom surface of the base.

20. The mask container according to claim 18, wherein the container is an inner pod for an extreme ultraviolet (EUV) mask, the cover is an inner pod cover, and the base is an inner pod base.

\* \* \* \* \*